United States Patent [19]

Miyamura et al.

[11] Patent Number: 4,925,773

[45] Date of Patent: May 15, 1990

[54] SOLDER RESIST INK COMPOSITION

[75] Inventors: Masataka Miyamura, Kamakura; Yuusuke Wada, Tokyo; Kazuhiro Takeda, Higashine; Yuji Nakaizumi, Tokyo; Teiji Kohara, Kawasaki, all of Japan

[73] Assignee: Kabushiki Kaisha Toshiba, Kawasaki, Japan

[21] Appl. No.: 135,049

[22] Filed: Dec. 18, 1987

[30] Foreign Application Priority Data

Dec. 26, 1986 [JP] Japan ............................ 61-315350
Oct. 13, 1987 [JP] Japan ............................ 62-256247

[51] Int. Cl.$^5$ .................... C08G 8/30; C08G 8/32; G03C 1/68
[52] U.S. Cl. .................... 430/285; 522/100; 522/103; 525/482; 525/922
[58] Field of Search ............ 522/100, 103; 430/285; 525/482, 922

[56] References Cited

U.S. PATENT DOCUMENTS

| 4,101,398 | 7/1978 | Hesse | 522/103 |
| 4,428,807 | 1/1984 | Lee | 522/103 |

FOREIGN PATENT DOCUMENTS

| 113409 | 7/1984 | European Pat. Off. |
| 207188 | 1/1987 | European Pat. Off. |
| 246467 | 11/1987 | European Pat. Off. |
| 2580828 | 10/1986 | France |
| 49-002601 | 1/1974 | Japan |
| 61-243869 | 10/1986 | Japan |
| 2025996 | 1/1980 | United Kingdom |

*Primary Examiner*—John C. Bleutge
*Assistant Examiner*—Arthur H. Koeckert
*Attorney, Agent, or Firm*—Oblon, Spivak, McClelland, Maier & Neustadt

[57] ABSTRACT

A solder resist ink composition is disclosed which contains a photo-curable resin obtained by causing an unsaturated monocarboxylic acid to react with a cresol-novolak- or phenolnovolak-type epoxy resin, and causing a polybasic carboxylic anhydride to react with the resultant reaction product, a photo-curable resin obtained by causing an unsaturated monocarboxylic acid to react with a bisphenol A novolak- or cycloaliphatic oxirane novolak-type opoxy resin, and causing a polybasic carboxylic anhydride to react with the resultant reaction product, at least one photo-polymerizable compound selected from photo-polymerizable monomers, a photo-polymerization initiator, an organic solvent, and an inorganic filler. Also disclosed are two other solder resist ink compositions each having a different photo-curable component.

4 Claims, No Drawings

SOLDER RESIST INK COMPOSITION

BACKGROUND OF THE INVENTION

1. Field of the Invention

The present invention relates to a solder resist ink composition used in a printed circuit and, more particularly, to a solder resist ink composition containing a photo-curable resin having a polymer skeleton of a novolak-type epoxy resin.

2. Description of the Prior Art

In order to protect a printed circuit and to prevent the unnecessary attachment of solder to portions of a printed circuit board other than those into which circuit components are soldered, a protective film pattern composed of a solder resist ink is formed on a surface of the circuit board.

According to a typical conventional method, a solder resist ink is screen-printed to form a protective film pattern on a circuit board. However, with recent increases in the packing density of printed circuits, use of a photoetching method has been investigated, for forming a protective film micropattern. As a result, a photo-curable solder resist ink is being developed for the purpose of photoetching. When forming a protective film pattern by means of photoetching, a photo-curable solder resist ink composition is applied to the surface of a printed circuit. Only a predetermined portion of the resist film is exposed light, by means of which it is cured. The nonexposed portion of the solder resist ink composition is dissolved and removed by a developing solution, whereby a desired protective film pattern is obtained.

Examples of the conventional photo-curable solder resist are compositions which contain photo-curable resins as main components and which are prepared by causing a compound containing a photo-sensitive group to react with an epoxy resin, as is described in Japanese Patent Disclosures Nos. 58-62636, 60-208377, and 61-272.

These photo-curable solder resist compositions, however, are required to use, as a developing agent, a flammable organic solvent prepared by mixing an alcohol- or ether-based solvent in cyclohexanol or 1,1,1-trichloroethane, or a chlorine-containing organic solvent. Use of these solvents pollutes the atmosphere and is detrimental to workers involved in the fabrication process. For this reason, special equipment must be provided to keep the atmosphere clean, which results in increased costs.

A conventional solder resist ink composition containing a cresolnovolak-type epoxy resin or a phenolnovolak-type epoxy resin as a main component has been proposed as a composition which instead uses an aqueous alkaline solution as the developing solution (Japanese Patent Disclosure No. 61-243869).

The solder resist ink composition using the cresolnovolak-type epoxy resin has good thermal resistance, a high degree of hardness, and good electrical characteristics and is free from stickiness during preliminary drying. However, there are also disadvantages in that the time required for photo-curing reaction is long and its development performance is low.

The solder resist ink composition using the phenolnovolak-type epoxy resin, on the other hand, has good photo-curing reaction and developing properties, but has poor heat resistance and electrical characteristics, low hardness, and has a sticky texture during preliminary drying.

SUMMARY OF THE INVENTION

It is accordingly an object of the present invention to provide a novel solder resist ink composition by means of which the problems associated with conventional photo-curable solder resist compositions can be resolved.

According to an aspect of the present invention, there is provided a solder resist ink composition which can be developed using an aqueous alkaline solution, thereby to assure a safe working atmosphere and safeguard the health of the workers involved in the fabrication process, when a high-resolution protective film pattern is formed by photoetching.

According to another aspect of the present invention, there is provided a solder resist ink composition which can provide a cured film pattern having good heat resistance, a high degree of hardness, and good electrical characteristics, which can be easily synthesized with good reaction properties, and is free from stickiness during preliminary drying.

A first solder resist ink composition (to hereinafter be referred to as the first invention) according to the present invention contains:

a photo-curable resin obtained by causing 0.9 to 1.0 equivalent of acrylic acid and/or methacrylic acid to react with one epoxy equivalent of a cresolnovolak-type epoxy resin, and causing 0.7 to 1.0 equivalent of a dicarboxylic acid anhydride to react with 1 equivalent of the resultant reaction product;

a photo-polymerization initiator;

an organic solvent; and an inorganic filler.

A second solder resist ink composition (to hereinafter be referred to as the second invention) contains:

a photo-curable resin (A1) obtained by causing an unsaturated monocarboxylic acid to react with a cresolnovolak-type epoxy resin, and causing a polybasic carboxylic anhydride to react with the resultant reaction product;

a photo-curable resin (B1) obtained by causing an unsaturated monocarboxylic acid to react with a phenolnovolak-type epoxy resin, and causing a polybasic carboxylic anhydride to react with the resultant reaction product;

at least one photo-polymerizable compound (C) selected from photo-polymerizable monomers;

a photo-polymerization initiator;

an organic solvent; and an inorganic filler.

A third solder resist ink composition (to hereinafter be referred to as a third invention) contains:

a photo-curable resin (A2) obtained by causing an unsaturated monocarboxylic acid to react with a cresolnovolak- or phenolnovolak-type epoxy resin, and causing a polybasic carboxylic anhydride to react with the resultant reaction product;

a photo-curable resin (B2) obtained by causing an unsaturated monocarboxylic acid to react with a bisphenol A novolak epoxy resin or epoxy vinyl cyclohexenepolyether, and causing a polybasic carboxylic anhydride to react with the resultant reaction product;

at least one photo-polymerizable compound (C) selected from photo-polymerizable monomers;

a photo-polymerization initiator;

an organic solvent; and an inorganic filler.

The photocurable resins, which constitute the major components of the solder resist ink compositions according to the first to third inventions, have the following aspects in common:

The unsaturated monocarboxylic acids are caused to react with novolak-type epoxy resins, and the polybasic carboxylic anhydrides are caused to react with the resultant reaction products. In addition, these compositions contain the photo-polymerization initiators, organic solvents, and inorganic fillers, as necessary components.

On the other hand, the conditions under which each of these photo-curable resins is manufactured, differ from each other.

The solder resist compositions of the second and third inventions differ from that of the first invention in that the solder resist composition of each of the second and third inventions contains component C, i.e., at least one photo-polymerizable compound selected from photo-polymerizable monomers, while the first invention does not.

DETAILED DESCRIPTION OF THE PREFERRED EMBODIMENT

The present invention will now be described in detail, and includes a description of all necessary reactions and functions.

The major components, i.e., photo-curable resins of the first to third inventions will be described below. These photo-curable resins ar synthesized by the following two-stage reactions.

In the first stage, a predetermined amount of an unsaturated carboxylic acid is caused to react with a novolak-type epoxy resin. In this reaction, the epoxy group reacts with the carboxyl group at a ratio of 1:1. The epoxy-ring is opened and at the same time a residue of the unsaturated monocarboxylic acid is esterbonded with the polymer skeleton. Epoxy-ring opening causes production of an OH group. In the first stage, triphenylphosphine is preferably used as a catalyst, and an antioxidant such as p-methylphenol is preferably used to prevent oxidation of the unsaturated bond.

In the second stage, a predetermined amount of a dicarboxylic acid anhydride is caused to react with the resultant reaction product of the first stage. The OH group produced by epoxy-ring opening is caused to react with the dicarboxylic acid anhydride at a ratio of 1:1, to form an ester bond. At the same time, a carboxyl group is produced at the other end of the residue of the acid anhydride. As a result, the carboxyl group is bonded to the polymer skeleton by means of the ester bond.

The photo-curable resins have the following aspects in common:

(1) The resins have a polymer skeleton of a novolak-type epoxy resin having good heat resistance;

(2) Good photo-curing properties, unobtainable by means of only the epoxy resin, are provided by the unsaturated bond (i.e., a polymerizable unsaturated bond such as an olefin double bond) in the residue of the unsaturated monocarboxylic acid; and (3) Solubility in an aqueous alkaline solution, i.e., good developing properties in the aqueous alkaline solution, is now possible by virtue of the carboxyl group contained in the residue of the polybasic carboxylic anhydride. If the polybasic carboxylic anhydride contains an unsaturated bond, this bond contributes to improved photo-curing properties.

In the photo-curable resin of the first invention, the type of epoxy resin used for its synthesis is limited to a cresolnovolak-type epoxy resin. In other words, other epoxy resins such as a bisphenol A epoxy resin, a bisphenol F epoxy resin, a diol glycidyl ether epoxy resin, a water-added bisphenol A epoxy resin, and a dicarboxylic diglycidylester epoxy resin cannot be used. When a photo-curable resin synthesized using an epoxy resin excluding the cresolnovolak-type epoxy resin is used, the heat resistance of the resultant solder resist film is degraded.

In the first-stage reaction, for synthesizing the photo-curable resin, 0.9 equivalent or more of acrylic acid and/or methacrylic acid must be used in the reaction with 1 epoxy equivalent of the cresolnovolak-type epoxy resin. If the content of acrylic and/or methacrylic acid is less than 0.9 equivalent, the resin will be cured by the residual nonreacted epoxy resin in the second stage. In the second-stage reaction, 0.7 equivalent or more of a dicarboxylic acid anhydride must be used in the reaction with 1 equivalent of the reaction product of the first stage. If the content of the dicarboxylic acid anhydride is less than 0.7 equivalent, the amount of carboxyl group added to the resin will be too small, degrading considerably the solubility of the resin in the aqueous alkaline solution. In the first invention, the desired photo-curing properties, the desired solubility in the aqueous alkaline solution, and the desired film formation properties are all obtained by defining the amount of the acrylic acid and dicarboxylic acid anhydride made to react with the epoxy resin, as described above.

Examples of the dicarboxylic acid anhydride are maleic anhydride, succinic anhydride, itaconic anhydride, phthalic anhydride, tetrahydrophthalic anhydride, and methylhexahydrophthalic anhydride.

In the second invention, photo-curable resin A1, obtained by using the cresolnovolak-type epoxy resin, and photo-curable resin B1, obtained by using the phenolnovolak-type epoxy resin, are used as epoxy resin components. The combination of two types of photo-curable resins is the most significant characteristic feature of the second invention. By means of this feature, the desired photo-curing properties, the desired solubility in the aqueous alkaline solution, and the desired film formation properties are all obtained. In this case, the mixing ratio A1:B1 of these two photo-curable resins is preferably 1.0:0.1 to 0.5 (epoxy equivalent). Commonly used photo-curable resins are limited to the above two resins. When a photo-curable resin having a polymer skeleton of another epoxy resin (e.g., a biphenol A epoxy resin, a bisphenol F epoxy resin, a diol glycidyl ether epoxy resin, a water-added bisphenol A epoxy resin, and a dicarboxylic acid diglycidyl ester epoxy resin) is used, the heat resistance of the resultant solder resist film is greatly degraded.

When photo-curable resins A1 and B1 of the second invention are to be synthesized, acrylic acid or methacrylic acid is preferable as an unsaturated monocarboxylic acid used in the reaction of the first stage. However, unlike the first invention, crotonic acid, cinnamic acid, or the like may be used. Alternatively, at least two unsaturated carboxylic acids may be simultaneously used. Multivalent carboxylic acid anhydrides each having three or more carboxyl groups (e.g., trimellitic acid anhydride, pyromellitic anhydride, and benzophenonetetracarboxylic acid anhydride) in addition to the dicarboxylic acid anhydride of the first invention may be used as a polybasic carboxylic anhydride used in the reaction of the second stage.

A mixing ratio of the unsaturated carboxylic acid and the polybasic carboxylic anhydride is not limited to a specific value. However, in each case of photo-curable resins A1 and B1, 0.5 to 1.2 equivalent of unsaturated monocarboxylic acid is preferably reacted with 1 epoxy equivalent of the novolak-type epoxy resin. If the amount of the unsaturated monocarboxylic acid is less than 0.5 equivalent, the resin is cured by the residual nonreacted epoxy group in the reaction of the second stage. In this sense, the amount of the unsaturated monocarboxylic acid is preferably 0.7 equivalent or more. The amount of the polybasic carboxylic anhydride is preferably 0.5 to 1.0 equivalent. If the amount of the polybasic carboxylic anhydride is less than 0.5 equivalent, the amount of introduced carboxyl group is small, and solubility in the aqueous alkaline solution is extremely degraded.

Photo-curable resins A1 and B2 which are independently prepared are normally used. However, resins may be simultaneously prepared as follows. A solution containing both a cresolnovolak-type epoxy resin and a phenolnovolak-type epoxy resin is used as a starting system, and the two-stage reaction is performed to simultaneously prepare photo-curable resins A1 and B1. In this case, the amounts of the unsaturated monocarboxylic acid and the polybasic carboxylic anhydride are determined with respect to a sum of epoxy equivalents of the epoxy resins.

In the third invention, photo-curable resin A2 synthesized by using the cresolnovolak- or phenolnovolak-type epoxy resin and photo-curable resin B2 synthesized by using the bisphenol A novolak-epoxy resin or epoxy vinyl cyclohexane-polyether resin are simultaneously employed as photocurable resin component. Of the epoxy resins used in the preparation of photo-curable resin B2, the epoxy vinyl cyclohexane-polyether resin has particularly excellent heat resistance. Examples of the epoxy resin belonging to this resin is represented by the following formula, e.g., EHPE (tradename) available from DAICEL CHEMICAL INDUSTRIES, LTD.

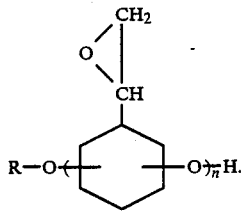

The combination of photo-curable resins A2 and B2 is the most significant characteristic feature of the third invention. This feature contributes to the desired photo-curing properties, desired solubility in the aqueous alkaline solution, and desired film formation properties. In this case, a mixing ratio A2:B2 of the two photo-curable resins is preferably 1.0:0.1 to 0.5 (epoxy equivalent, wherein the equivalents are the original epoxy equivalents on the said cresolnovolak- or phenonovolak-epoxy resin and on the bisphenol A novolak epoxy resin or epoxy vinyl cyclohexene-polyether resin). The simultaneously used photo-curable resins are limited to the ones describe above. When a photo-curable resin having a resin skeleton of another epoxy resin is used, the solder heat resistance of the resultant resist film is degraded.

During synthesis of photo-curable resins A2 and B2 in the third invention, the unsaturated monocarboxylic acid used in the reaction of the first stage and the polybasic carboxyl anhydride used in the reaction of the second stage are the same as those of the second invention. The mixing ratios of the unsaturated carboxylic acid and the polybasic carboxylic anhydride are the same as that of the second invention. The above conditions are not limited. However, 0.5 to 1.2 equivalent (more preferably 0.7 equivalent or more) of the unsaturated monocarboxylic acid is preferably reacted with 1 epoxy equivalent of the novolak-type epoxy resin and 0.5 to 1.0 equivalent of the polybasic carboxylic anhydride is preferably reacted with 1 epoxy equivalent of the novolak-type epoxy resin for the same reason as in the second invention.

In the second invention and the third invention, photo-polymerizable monomers excluding the above photo-curable resins are used as a component for enhancing the photo-curing properties. The photo-polymerizable monomer also serves as a diluent of the photo-curable resin. 0.01 to 0.2 equivalent of the photo-polymerizable monomer is preferably reacted with 1 epoxy equivalent of the total photo-curable resins. First examples of the photo-polymerizable monomer are hydroxyethylacrylate, hydroxypropylacrylate N-vinylpyrrolidone, acryloylmorpholine, methoxytetraethylene glycol acrylate, polyethylene glycol acrylate, N,N-dimethylacrylamide, N-methylolacrylamide, N,N-dimethylaminopropylacrylamide, and water-soluble monomers of methacrylates corresponding to the above acrylates. Second examples of the photo-polymerizable monomer are diethylene glycol diacrylate, triethylene glycol diacrylate, propylene glycol diacrylate, tripropylene glycol diacrylate, polypropylene glycol diacrylate, phenoxyethylacrylate, tetrahydrofurfurylacrylate, cyclohexylacrylate, trimethylolpropane diacrylate, trimethylolpropane triacrylate, glycerine diglycidyl ether diacrylate, pentaerythritol triacrylate, pentaerythritol tetraacrylate, and methacrylates corresponding to the above acrylates.

The common components of the first to third inventions will be described below.

The photo-polymerization initiator is a component mixed for curing the photo-curable resin upon light radiation. A radical initiator known as a photo-polymerization initiator of this acrylate is used as photo-polymerization initiator. Such a photo-polymerization initiator generates a radical upon light radiation. This radical allows a polymerization or crosslinking reaction of unsaturated bonds contained in the photo-curable resin or the photo-polymerizable monomer, thereby curing the solder resist ink composition. 1 to 15 parts by weight and preferably 3 to 8 parts by weight of the photo-polymerization initiator are added to 100 parts by weight of the total weight of the photo-curable resin and the photo-polymerizable monomer. If the content of the photo-polymerization initiator is less than 1 part by weight, the photo-curing properties are degraded. However, if the content exceeds 15 parts by weight, heat resistance, moisture resistance, and electrical characteristics of the cured solder resist tend to be degraded. Examples of the photo-polymerization initiator are carbonyl compounds such as diacetyl, acetophenone, benzophenone, benzil, benzoin isobutyl ether, benzil dimethyl ketal, (1-hydroxycyclohexyl)phenyl ketone, (1-hydroxy-1-methylethyl)phenyl ketone, and p-isopropyl-hydroxyisobutylphenone. Other examples of the photo-polymerization initiator are composite photo-polymerization initiators of ketones such as diethylthioxanthone and ethylanthraquinone with amines such as bis(dimethylamino)benzophenone, ethyl(dimethylamine)benzoate, benzyldimethylamine, and triethanolamine. The above photo-polymerization initiators may be used singly or as a mixture of at least two initiators.

The organic solvent is used to decrease the viscosity of the resist ink and improve the coating properties. The content of the organic solvent is not limited but preferably falls within the range of 10 to 40 parts by weight with respect to 100 parts by weight of the total weight of the photo-curable resin and the photo-polymerizable monomer from the viewpoint of workability during coating. Examples of such an organic solvent are an aromatic hydrocarbon (e.g., toluene or xylene), an alcohol (e.g., methanol, isopropyl alcohol, ethylene glycol monobutyl ether, or ethylene glycol monomethyl ether), an ester (e.g., ethyl acetate or butyl acetate), an ether (e.g., 1,4-dioxane, tetrahydrofuran, or diethylene glycol dimethyl ether), a ketone (e.g., methyl ethyl ketone, or methyl isobutyl ketone), an aliphatic compound (e.g., cyclohexanone or cyclohexanol), and a petroleum solvent (e.g., petroleum ether or petroleum naphtha).

The inorganic filler is used to improve various properties such as solder heat resistance, adhesion strength, and surface hardness of the resist ink. The content of the inorganic filler preferably falls within the range of 10 to 60 parts by weight and more preferably 15 to 50 parts by weight with respect to 100 parts by weight of the total weight of the photo-curable resin and the photo-polymerizable monomer. If the content of the inorganic filler is less than 10 parts by weight, a mixing effect of the inorganic filler cannot be sufficiently achieved. However, if the content exceeds 60 parts by weight, the photo-curing properties of the solder resist tend to be degraded. Examples of such an inorganic filler are silica, talc, and hydrated alumina.

In addition to the components described above, a fire retardant agent, a dye, a pigment, a defoaming agent, a leveling agent, a polymerization inhibitor, an adhesive, and the like may be added to the solder resist ink compositions of the first to third inventions.

A method of forming a solder resist pattern by using the solder resist ink composition of the present invention will be described below.

A solder resist ink composition of the present invention is applied to a printed circuit and is dried at 50° to 100° C. and preferably 60° to 90° C. to evaporate the organic solvent, thereby forming a solder resist film. Subsequently, the solder resist film is irradiated with light through a negative mask with a predetermined pattern, and the exposed portion is cured. Light has a wavelength of 180 to 700 nm and preferably 250 to 400 nm. The exposed solder resist film is developed by an aqueous alkaline solution and the nonexposed portion is dissolved and removed, thereby obtaining a desired pattern. The desired pattern is then heated and/or irradiated with light to complete the curing reaction. The resultant film serves as a solder resist pattern as a protective film. In this case, the heating temperature falls within the range of 50° to 220° C. and preferably 100° to 200° C.

According to the solder resist ink composition of the present invention described above, a high-resolution solder resist pattern can be obtained by using a photo-etching method. In addition, since development can be performed using the aqueous alkaline solution, the safe working atmosphere and workers' health can be assured.

The present invention will be described in detail by way of its Examples and Comparative Examples. "Parts" in the following description denote "parts by weight".

The following tests were performed for samples in Examples and Comparative Examples. Protective film patterns were formed on printed circuits by using respective solder resist ink compositions, and stickiness after preliminary drying and developing properties were examined. Checkerboard tape peeling tests, heat-resistance tests, pencil hardness tests, and insulation tests of solder film patterns were performed. Test methods and their evaluation methods are as follows.

Stickiness After Preliminary Drying

Solder resist inks were applied to substrate and were preliminarily dried at 70° C. for 30 minutes to evaporate the solvents, and stickiness of the films was checked by touching with a finger.

Developing Properties

Sample films were developed by a 1% $Na_2CO_3$ solution after their exposure and the developing properties were evaluated by states of the resultant resist film patterns.

Checkerboard Tape Peeling

Checkerboard cut patterns were formed on sample films and the peeling test with Cellophane tape pieces was performed complying with JIS D-0202. The samples were evaluated by a ratio of the number of nonpeeled samples to the total number of samples.

Heat-Resistance Test

Samples were dipped in a 260° C. solder bath three times within 20 sec. each, and changes in films and its adhesion states were observed.

Pencil Hardness Test

Highest hardness values by which the samples are not scratched were measured when a weight of 1 kg was applied by a pencil hardness tester according to a test method complying with JIS K-5400.

Insulation Test

Electric resistances of the samples were measured in (1) a state complying with method 2.5.23 of IPC-SM-840 and in (2) a state after leaving to an atmosphere at 50° C. and a relative humidity of 95% for 7 days.

EXAMPLE 1

(First Invention)

(Synthesis of Photo-Curable Resin)

500 parts (epoxy equivalent 220) of cresolnovolak-type epoxy resin EPICRON N-690 (tradename) available from DAINIPPON INK & CHEMICALS, INC. were heated and dissolved in 100 parts of toluene at 100° C. 2 parts of p-methoxyphenol as an antioxidant and 5 parts of triphenylphosphine as a catalyst were added to the resultant mixture and dissolved therein. 165 parts (2.292 equivalent) of acrylic acid were added to and reacted with the solution for 5 hours while air was supplied thereto and the solution was maintained at 95° C.

230 parts (2.347 equivalent) of maleic anhydride dissolved in 100 parts of dioxane were added to the reacted solution and were reacted therewith at 90° C. for 6 hours, and 250 parts of 2-ethoxyethylacetate were added thereto. The solution was then cooled to room temperature to prepare photo-curable resin (a-1).

(Preparation of Solder Resist Ink)

As shown in Table 1, 150 parts of photo-curable resin (a-1), 30 parts of ethylene glycol mono-n-butyl ether, 7 parts of benzil dimethyl ketal, 2 parts of diethylthioxanthone, 1.5 parts of phthalocyanine green, 2 parts of silica powder, and 20 parts of talc were mixed, and the resultant mixture was kneaded by a roll to prepare a solder resist ink composition.

(Formation of Solder Resist Cured Film Pattern)

The resultant solder resist ink composition was applied to an IPC-B-25 test substrate by screen printing to form a film having a thickness of 35 $\mu$m. The film was dried at 80° C. for 30 minutes to form a solder resist film.

The resultant solder resist film was selectively exposed with a high-voltage ultraviolet mercury lamp as a light source through a negative mask. An illuminance of radiation was 10 mW/cm$^2$ and an exposure time was 100 seconds.

The exposed pattern was developed by spraying of a 1% aqueous sodium carbonate solution for 60 seconds and was heated and cured at 140° C. for one hour and further cured with UV curing using a high-voltage mercury lamp of 1,500 mJ/cm$^2$. A high-precision cured solder resist pattern accurately corresponding to the negative mask pattern was formed.

Results of the checkerboard tape peeling, heat-resistance, pencil hardness, and insulation tests are summarized in Table 1.

EXAMPLE 2

(First Invention)

500 parts (epoxy equivalent 212) of cresolnovolak-type epoxy resin EPICRON N-673 (tradename) available from DAINIPPON INK & CHEMICALS INC. were heated and dissolved in 100 parts of 1,4-dioxane at 100° C. The two-stage reaction was performed using 165 parts of acrylic acid and 230 parts of maleic anhydride, following the same procedures as in Example 1 to prepare photo-curable resin (a-2).

A solder resist ink composition having the same composition a in Example 1 except that 150 parts of photo-curable resin (a-2) were used as shown in Table 1 was prepared.

A high-precision cured solder resist pattern was formed using the above solder resist ink composition, following the same procedures as in Example 1. Results of the checkerboard tape peeling, heat-resistance, pencil hardness, and insulation tests are summarized in Table 1.

EXAMPLE 3

(First Invention)

500 parts (epoxy equivalent 212) of cresolnovolak-type epoxy resin EPICRON N-673 (tradename) available from DAINIPPON INK & CHEMICALS INC. were heated and dissolved in 100 parts of toluene at 100° C. Photo-curable resin (a-3) was prepared by a two-stage reaction following the same procedures as in Example 1 except that 169 parts (2.347 equivalent) of acrylic acid and 340 parts (2.297 equivalent) of phthalic anhydride were used.

A solder resist ink composition having the same composition as in Example 1 except that 149 parts of photo-curable resin (a-3) were used as shown in Table 1 was prepared.

A high-precision cured solder resist pattern was formed using the above solder resist ink composition, following the same procedures as in Example 1. Results of the checkerboard tape peeling, heat-resistance, pencil hardness, and insulation tests are summarized in Table 1.

EXAMPLE 4

(First Invention)

Photo-curable resin (a-4) was prepared following the same procedures as in Example 3 except that 230 parts (2.300 equivalent) of succinic anhydride were used in place of 340 parts of phthalic anhydride.

A solder resist ink composition having the same composition as in Example 1 except that 150 parts of photo-curable resin (a-4) were used as shown in Table 1 was prepared.

A high-precision cured solder resist pattern was formed using the above solder resist ink composition, following the same procedures as in Example 1. Results of the checkerboard tape peeling, heat-resistance, pencil hardness, and insulation tests are summarized in Table 1.

COMPARATIVE EXAMPLE 1

500 parts (epoxy equivalent 250) of bisphenol A epoxy resin EPICRON 860 (tradename) available from DAINIPPON INK & CHEMICALS INC. were heated and dissolved in 50 parts of toluene at 100° C. A two-stage reaction was performed following the same procedures as in Example 1 except that 140 parts (1.944 equivalent) of acrylic acid, 190 parts (1.939 equivalent) of maleic anhydride, and 100 parts of 2-ethoxyethylacetate were used, thereby preparing photo-curable resin (Ra-1).

A solder resist ink composition having the same composition as in Example 1 except that 130 parts of photo-curable resin (Ra-1) were used as shown in Table 1 was prepared.

Following the same procedures as in Example 1, a solder resist pattern was prepared by the above resist ink composition. The solder resist pattern was partially blistered during heating and curing.

COMPARATIVE EXAMPLE 2

500 parts (epoxy equivalent 180) of bisphenol F epoxy resin EPICRON 830 (tradename) available from DAINIPPON INK & CHEMICALS INC., 2 parts of p-methoxyphenol as an antioxidant, and 5 parts of triphenylphosphine as a basic catalyst were heated and dissolved. 200 parts (2.778 equivalent) of acrylic acid were added to the resultant solution and were reacted therewith for 3 hours while the solution was maintained at 95° C. by supplying air. 260 parts (2.653 equivalent) of maleic anhydride dissolved in 100 parts of dioxane were added to the solution and were reacted therewith at 90° C. for 5 hours. 50 parts of 2-ethoxyethylacetate were added to the solution, and the resultant solution was cooled to room temperature, thereby obtaining photo-curable resin (Ra-2).

A solder resist ink composition having the same composition as in Example 1 except that photo-curable resin (Ra-2) were used as shown in Table 1 was prepared.

Following the same procedures as in Example 1, a solder resist pattern was prepared by the above resist ink composition. The solder resist pattern was partially blistered during heating and curing.

ture was kneaded by a roll to prepare a solder resist ink composition.

(Formation of Solder Resist Cured Film Pattern)

Following the same procedures as in Example 1, the solder resist ink composition was used to form a high-precision cured solder resist pattern.

Stickiness after preliminary drying was checked and the developing test, the checkerboard tape peeling test, the heat-resistance test, the pencil hardness test, and the insulation test were performed, and the results are summarized in Table 2.

EXAMPLE 6

(Second Invention)

(Synthesis of Photo-Curable Resin)

TABLE 1

|  | Example | | | | Comparative Example | |
| --- | --- | --- | --- | --- | --- | --- |
|  | 1 | 2 | 3 | 4 | 1 | 2 |
| a-1 | 150 | | | | | |
| a-2 | | 150 | | | | |
| a-3 | | | 149 | | | |
| a-4 | | | | 150 | | |
| Ra-1 | | | | | 130 | |
| Ra-2 | | | | | | 116 |
| Benzil Dimethyl Ketal | 7 | 7 | 7 | 7 | 7 | 7 |
| Diethylthioxanthone | 2 | 2 | 2 | 2 | 2 | 2 |
| Phthalocyanine Green | 1.5 | 1.5 | 1.5 | 1.5 | 1.5 | 1.5 |
| Silica Powder | 2 | 2 | 2 | 2 | 2 | 2 |
| Talc | 20 | 20 | 20 | 20 | | |
| Checkerboard Tape Peeling Test | 100/100 | 100/100 | 100/100 | 100/100 | Blistering after Heating and Curing | 100/100 Bistering Occurrence |
| Heat-Resistance Test | ○ | ○ | ○ | ○ | | |
| Pencil Hardness | 5H | 5H | 5H | 4H | | — |
| (=) Insulation ① ($\Omega$) ② | $4.5 \times 10^{14}$ $8.1 \times 10^{11}$ | $6.7 \times 10^{14}$ $4.7 \times 10^{11}$ | $5.9 \times 10^{14}$ $5.2 \times 10^{11}$ | $2.0 \times 10^{14}$ $6.0 \times 10^{11}$ | — | — |

EXAMPLE 5

(Second Invention)

(Synthesis of Photo-Curable Resin)

Photo-curable resin a-1 was synthesized following the same procedures as in Example 1. Photo-curable resin b-1 was synthesized independently of resin a-1 in the following manner.

450 parts (epoxy equivalent 172) of phenolnovolak-type epoxy resin EPICOAT 152 (tradename) available from Yuka Shell K.K. were heated and dissolved in 100 parts of toluene at 100° C. 2 parts of p-methoxyphenol as an antioxidant and 5 parts of triphenylphosphine as a basic catalyst were added and dissolved in the solution. 165 parts (2.292 equivalent) of acrylic acid were added to the solution and were reacted therewith for 5 hours while the solution was maintained at 95° C. by supplying air.

230 parts (2.347 equivalent) of maleic anhydride dissolved in 100 parts of dioxane were added to the solution and were reacted therewith at 90° C. for 6 hours. 250 parts of 2-ethoxyethylacetate were added to the solution, and the resultant solution was cooled to room temperature to obtain photo-curable resin (b-1). (Preparation of Solder Resist Ink)

150 parts of photo-curable resin a-1, 50 parts of photo-curable resin b-1, 30 parts of, ethylene glycol mono-n-butyl ether, 2 parts of benzil dimethyl ketal, 1.5 parts of phthalocyanine green, 2 parts of silica powder, and 20 parts of talc were mixed, and the resultant mix- 300 parts (epoxy equivalent 212) of cresolnovolak-type epoxy resin EPICRON N-673 (tradename) available from DAINIPPON INK & CHEMICALS INC. were heated and dissolved in 100 parts of 1,4-dioxane at 100° C. 2 parts of p-methoxyphenol and 5 parts of triphenylphosphine were dissolved in this solution. 100 parts (1.375 equivalent) of acrylic acid were added to the solution and were reacted therewith for 5 hours while the solution was maintained at 95° C. by supplying air.

138 parts (1.408 equivalent) of maleic anhydride dissolved in 100 parts of dioxane were added to the solution and reacted therewith at 90° C. for 6 hours. 250 parts of 2-ethoxyethylacetate were added to the solution and the resultant solution was cooled to room temperature to prepare photo-curable resin (a-5). This photo-curable resin was substantially the same as photo-curable resin a-2 prepared in Example 2, except for the contents of acrylic acid component and maleic anhydride component with respect to the epoxy resin component.

Photo-curable resin b-2 was prepared independently of resin a-5 in the following manner.

270 parts (epoxy equivalent 180) of phenolnovolak-type epoxy resin EPICOAT 154 (tradename) available from Yuka Shell K.K. were heated and dissolved in 100 parts of toluene at 100° C. Photo-curable resin b-2 was prepared following the same procedures as in photo-curable resin a-5.

(Preparation of Solder Resist Ink)

A solder resist ink composition was prepared following the same procedures as in Example 5 except that 150 parts of photo-curable resin a-5 and 50 parts of photo-curable resin b-2 were used, as shown in Table 2.

(Formation of Solder Resist Cured Film Pattern)

Following the same procedures as in Example 1, the above solder resist ink composition was used to prepare a high-precision cured solder resist pattern.

Stickiness after preliminary drying was checked, and the developing test, the checkerboard tape peeling test, the heat-resistance test, the pencil hardness test, and the insulation test were made, and results are summarized in Table 2.

EXAMPLE 7

(Second Invention)

(Synthesis of Photo-Curable Resin)

300 parts (epoxy equivalent 212) of cresolnovolak-type epoxy resin EPICRON N-673 (tradename) available from DAINIPPON INK & CHEMICALS INC. and as used in synthesis of photo-curable resin a-5 of Example 6, and 200 parts (epoxy equivalent 180) of phenolnovolak-type epoxy resin EPICOAT 154 (tradename) available from Yuka Shell K.K. and as used in synthesis of photo-curable resin b-2 were heated and dissolved in 100 parts of 1,4-dioxane at 100° C. 2 parts of p-methoxyphenol and 5 parts of triphenylphosphine were then added to the solution. 169 parts (2.347 equivalent) of acrylic acid were added to the solution and reacted therewith for 3 hours while the solution was maintained at 95° C. by supplying air.

340 parts (2.297 equivalent) of maleic anhydride dissolved in 100 parts of dioxane were added to the solution and reacted therewith at 90° C. for 5 hours. 250 parts of 2-ethoxyethylacetate were added to the solution, and the resultant solution was cooled to room temperature to obtain photo-curable resin (ab-1).

(Preparation of Solder Resist Ink)

A solder resist ink composition was prepared following the same procedures as in Example 5 except that 150 parts of photo-curable resin ab-1 were used singly, as shown in Table 2.

(Formation of Solder Resist Cured Film Pattern)

Following the same procedures as in Example 1, the above solder resist ink composition was used to prepare a high-precision cured solder resist pattern.

Stickiness after preliminary drying was checked, and the developing test, the checkerboard tape peeling test, the heat-resistance test, the pencil hardness test, and the insulation test were performed. Results are summarized in Table 2.

EXAMPLE 8

(Second Invention)

A solder resist ink composition was prepared following the same procedures as in Example 5 except that 100 parts of photo-curable resin a-1 prepared in Example 5 and 50 parts of photo-curable resin b-2 prepared in Example 6 were used, as shown in Table 2.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 2.

EXAMPLE 9

(Second Invention)

A solder resist ink composition was prepared following the same procedures as in Example 5 except that 100 parts of photo-curable resin b-1 prepared in Example 5 and 50 parts of photo-curable resin a-5 prepared in Example 6 were used, as shown in Table 2.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 2.

EXAMPLE 10

(Second Invention)

A solder resist ink composition was prepared following the same procedures as in Example 5 except that 150 parts of photo-curable resin ab-1 prepared in Example 7 and 15 parts of hexafunctional acrylate DPHA (tradename) available from NIPPON KAYAKU CO., LTD. as a photo-polymerizable monomer were used, as shown in Table 2.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 2.

COMPARATIVE EXAMPLE 3

(Synthesis of Photo-Curable Resin)

380 parts (epoxy equivalent 190) of bisphenol A epoxy resin EPICOAT 828 (tradename) available from Yuka Shell K.K. were heated and dissolved in 100 parts of 1,4-dioxane at 100° C. 2 parts of p-methoxyphenol and 5 parts of triphenylphosphine were added to the solution and dissolved therein. 140 parts (1.944 equivalent) of acrylic acid were added to the solution and reacted therewith for 3 hours while the solution was maintained at 95° C. by supplying air.

190 parts (1.939 equivalent) of maleic anhydride dissolved in 100 parts of dioxane were added to the solution and reacted at 90° C. for 5 hours. 100 parts of 2-ethoxyethylacetate were added to the solution, and the resultant solution was cooled to room temperature to prepare photo-curable resin (Ra-3).

(Preparation of Solder Resist Ink)

Following the same procedures as in Example 5, 150 parts of photo-curable resin Ra-3 were used singly to prepare a solder resist ink composition.

(Formation of Solder Resist Cured Film Pattern)

Following the same procedures as in Example 1, the solder resist ink composition was used to form a solder resist pattern. The cured solder resist pattern wa partially blistered during heating and curing. Stickiness after preliminary drying was checked, and the developing test, the checkerboard tape peeling test, the heat-resistance test, the pencil hardness test, and the insulation test were made. Results are summarized in Table 2.

COMPARATIVE EXAMPLE 4

(Synthesis of Photo-Curable Resin)

344 parts (epoxy equivalent 178) of phenolnovolak-type epoxy resin EPICOAT 154 (tradename) available from Yuka Shell K.K. were heated and dissolved in 100 parts of toluene at 80° C. 2 parts of p-methoxyphenol and 5 parts of triphenylphosphine were added to the solution and dissolved therein. 165 parts (2.292 equivalent) of acrylic acid were added to the solution and reacted therewith for 2 hours while the solution was maintained at 95° C. by supplying air.

230 parts (2.347 equivalent) of maleic anhydride dissolved in 100 parts of dioxane were added to the solution and reacted at 70° C. for 3 hours. 250 parts of 2-ethoxyethylacetate were added to the solution, and the resultant solution was cooled to room temperature to prepare photo-curable resin (Ra-4).

(Preparation of Solder Resist Ink)

Following the same procedures as in Example 5, 150 parts of photo-curable resin Ra-4 were used singly to prepare a solder resist ink composition.

(Formation of Solder Resist Cured Film Pattern)

Following the same procedures as in Example 1, the solder resist ink composition was used to form a solder resist pattern. The cured solder resist pattern was partially blistered during heating and curing. Stickiness after preliminary drying was checked, and the developing test, the checkerboard tape peeling test, the heat-resistance test, the pencil hardness test, and the insulation test were made. Results are summarized in Table 2.

COMPARATIVE EXAMPLE 5

(Synthesis of Photo-Curable Resin)

300 parts (epoxy equivalent 212) of cresolnovolak-type epoxy resin EPICRON N-673 (tradename) available from DAINIPPON INK & CHEMICALS INC. were heated and dissolved in 90 parts of toluene at 90° C. 2 parts of p-methoxyphenol and 5 parts of triphenylphosphine were added to the solution and dissolved therein. 100 parts (1.375 equivalent) of acrylic acid were added to the solution and reacted therewith for 3 hours while the solution was maintained at 95° C. by supplying air.

138 parts (1.408 equivalent) of maleic anhydride dissolved in 100 parts of dioxane were added to the solution and reacted at 90° C. for 3 hours. 200 parts of 2-ethoxyethylacetate were added to the solution, and the resultant solution was cooled to room temperature to prepare photo-curable resin (Ra-5).

(Preparation of Solder Resist Ink)

Following the same procedures as in Example 5, 150 parts of photo-curable resin Ra-5 were used singly to prepare a solder resist ink composition.

(Formation of Solder Resist Cured Film Pattern)

Following the same procedures as in Example 1, the solder resist ink composition was used to form a solder resist pattern. The cured solder resist pattern was partially blistered during heating and curing. Stickiness after preliminary drying was checked, and the developing test, the checkerboard tape peeling test, the heat-resistance test, the pencil hardness test, and the insulation test were made. Results are summarized in Table 2.

TABLE 2

|  | Example | | | | | | Comparative Example | | |
| --- | --- | --- | --- | --- | --- | --- | --- | --- | --- |
|  | 5 | 6 | 7 | 8 | 9 | 10 | 3 | 4 | 5 |
| a-1 | 100 |  |  | 100 |  |  |  |  |  |
| b-1 | 50 |  |  |  | 100 |  |  |  |  |
| a-5 |  | 100 |  |  |  | 50 |  |  |  |
| b-2 |  | 50 |  | 50 |  |  |  |  |  |
| ab-1 |  |  | 150 |  |  | 150 |  |  |  |
| Ra-3 |  |  |  |  |  |  | 150 |  |  |
| Ra-4 |  |  |  |  |  |  |  | 150 |  |
| Ra-5 |  |  |  |  |  |  |  |  | 150 |
| DPHA |  |  |  |  |  | 15 |  |  |  |
| Ethylene Glycol Mono-n-butyl Ether | 30 | 30 | 30 | 30 | 30 | 30 | 30 | 30 | 30 |
| Benzyl Methyl Ketal | 2 | 2 | 2 | 2 | 2 | 2 | 2 | 2 | 2 |
| Phthalocyanine Green | 1.5 | 1.5 | 1.5 | 1.5 | 1.5 | 1.5 | 1.5 | 1.5 | 1.5 |
| Silica Powder | 2 | 2 | 2 | 2 | 2 | 2 | 2 | 2 | 2 |
| Talc | 30 | 30 | 30 | 30 | 30 | 30 | 30 | 30 | 30 |
| Sticking after Preliminary Drying | No | No | No | No | No | No | Yes | Yes | No |
| Developing Properties | Good | Good | Good | Good | Good | Good | Fair | Good | Fair |
| Checkerboard Tape Peeling Test | 100/100 | 100/100 | 100/100 | 100/100 | 100/100 | 100/100 | 20/100 | 100/100 | 100/100 |
| Heat Resistance | OK | OK | OK | OK | OK | OK | OUT | OK | OK |
| Pencil Hardness | 5H | 5H | 5H | 5H | 5H | 5H | 4H | 5H | 5H |
| *Electric Insulation Properties | ① 5.2 ② 6.2 | 6.2 7.3 | 3.5 5.6 | 5.9 3.8 | 4.8 9.2 | 6.7 8.0 | 43.2 83.9 | 8.9 6.7 | 5.0 5.2 |

*Ω ① × $10^{14}$
② × $10^{11}$

EXAMPLE 11

(Third Invention)

(Synthesis of Photo-Curable Resin)

Photo-curable resin a-1 was synthesized following the same procedures as in Example 1. Photo-curable resin c-1 was synthesized independently of resin a-1 in the following manner.

550 parts (epoxy equivalent 210) of bisphenol A novolak-type epoxy resin EPICOAT 157 (tradename) available from Yuka Shell K.K. were heated and dissolved in 100 parts of toluene at 100° C. 2 parts of p-methoxyphenol as an antioxidant and 5 parts of triphenylphosphine as a basic catalyst were added and dissolved in the solution. 165 parts (2.292 equivalent) of acrylic acid were added to the solution and were reacted therewith for 5 hours while the solution was maintained at 95° C. by supplying air.

230 parts (2.347 equivalent) of maleic anhydride dissolved in 100 parts of dioxane were added to the solution and were reacted therewith at 90° C. for 6 hours. 250 parts of 2-ethoxyethylacetate were added to the solution, and the resultant solution was cooled to room temperature to obtain photo-curable resin (c-1).

(Preparation of Solder Resist Ink)

100 parts of photo-curable resin a-1, 50 parts of photo-curable resin c-1, 30 parts of ethylene glycol mono-n-butyl ether, 2 parts of benzil dimethyl ketal, 1.5 parts of phthalocyanine green, 2 parts of silica powder, and 30 parts of talc were mixed, as shown in Table 3 and the resultant mixture was kneaded by a roll to prepare a solder resist ink composition.

(Formation of Solder Resist Cured Film Pattern)

Following the same procedures as in Example 1, the solder resist ink composition was used to form a high-precision cured solder resist pattern.

Stickiness after preliminary drying was checked and the developing test, the checkerboard tape peeling test, the heat-resistance test, the pencil hardness test, and the insulation test were performed, and the results are summarized in Table 3.

EXAMPLE 12

(Third Invention)

(Synthesis of Photo-Curable Resin)

300 parts (epoxy equivalent 212) of cresolnovolak-type epoxy resin EPICRON N-673 (tradename) available from DAINIPPON INK & CHEMICALS INC. were heated and dissolved in 100 parts of 1,4-dioxane at 100° C. 3 parts of p-methoxyphenol and 4 parts of triphenylphosphine were dissolved in this solution. 100 parts (1.375 equivalent) of acrylic acid were added to the solution and were reacted therewith for 4 hours while the solution was maintained at 90° C. by supplying air.

230 parts (2.347 equivalent) of maleic anhydride dissolved in 100 parts of dioxane were added to the solution and reacted therewith at 90° C. for 5 hours. 250 parts of 2-ethoxyethylacetate were added to the solution and the resultant solution was cooled to room temperature to prepare photo-curable resin (a-6).

Photo-curable resin c-2 was prepared independently of resin a-5 in the following manner.

420 parts (epoxy equivalent 186) of bisphenol A novolak-type epoxy resin EPICRON N-880 (tradename) available from DAINIPPON INK & CHEMICALS INC. were heated and dissolved in 100 parts of toluene at 100° C. Photo-curable resin c-2 was prepared following the same procedures as in photo-curable resin a-5.

(Preparation of Solder Resist Ink)

A solder resist ink composition was prepared following the same procedures as in Example 11 except that 150 parts of photo-curable resin a-6 and 50 parts of photo-curable resin c-2 were used, as shown in Table 3.

(Formation of Solder Resist Cured Film Pattern)

Following the same procedures as in Example 1, the above solder resist ink composition was used to prepare a high-precision cured solder resist pattern.

Stickiness after preliminary drying was checked, and the developing test, the checkerboard tape peeling test, the heat-resistance test, the pencil hardness test, and the insulation test were made, and results are summarized in Table 3.

EXAMPLE 13

(Third Invention) (Synthesis of Photo-Curable Resin)

300 parts (epoxy equivalent 212) of cresolnovolak-type epoxy resin EPICRON N-673 (tradename) available from DAINIPPON INK & CHEMICALS INC. and as used in synthesis of photo-curable resin a-6 of Example 12, and 250 parts (epoxy equivalent 210) of bisphenol A novolak-type epoxy resin EPICOAT 157 (tradename) available from Yuka Shell K.K. and as used in synthesis of photo-curable resin c-1 were heated and dissolved in 100 parts of 1,4-dioxane at 100° C. 2 parts of p-methoxyphenol and 5 parts of triphenylphosphine were then added to the solution. 169 parts (2.347 equivalent) of acrylic acid were added to the solution and reacted therewith for 4 hours while the solution was maintained at 90° C. by supplying air.

340 parts (2.297 equivalent) of maleic anhydride dissolved in 100 parts of dioxane were added to the solution and reacted therewith at 90° C. for 5 hours. 250 parts of 2-ethoxyethylacetate were added to the solution, and the resultant solution was cooled to room temperature to obtain photo-curable resin (ac-1).

(Preparation of Solder Resist Ink)

A solder resist ink composition was prepared following the same procedures as in Example 11 except that 150 parts of photo-curable resin ac-1 were used singly, as shown in Table 3.

(Formation of Solder Resist Cured Film Pattern)

Following the same procedures as in Example 1, the above solder resist ink composition was used to prepare a high-precision cured solder resist pattern.

Stickiness after preliminary drying was checked, and the developing test, the checkerboard tape peeling test, the heat-resistance test, the pencil hardness test, and the insulation test were performed. Results are summarized in Table 3.

EXAMPLE 14

(Third Invention)

A solder resist ink composition was prepared following the same procedures as in Example 11 except that 100 parts of photo-curable resin a-1 prepared in Example 11 and 60 parts of photo-curable resin c-2 prepared in Example 12 were used, as shown in Table 3.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 3.

EXAMPLE 15

(Third Invention)

A solder resist ink composition was prepared following the same procedures as in Example 11 except that 50 parts of photo-curable resin c-1 prepared in Example 11 and 100 parts of photo-curable resin a-6 prepared in Example 12 were used, as shown in Table 3.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 3.

EXAMPLE 16

(Third Invention)

Photo-curable resin a-6 was synthesized following the same procedures as in Example 12. Photo-curable resin d-1 was synthesized independently of synthesis of resin a-6 in the following manner.

350 parts (epoxy equivalent 220) of epoxy vinyl cyclohexene-polyether resin EHPE (tradename) available from DAICEL CHEMICAL INDUSTRIES, INC. were heated and dissolved in 200 parts of toluene at 100° C. Photo-curable resin d-1 was prepared following the same procedures as in photo-curable resin a-6 except for the above process.

(Preparation of Solder Resist Ink)

A solder resist ink composition was prepared following the same procedures as in Example 5 except that 100 parts of photo-curable resin a-5 and 50 parts of photo-curable resin d-1 were used.

(Formation of Solder Resist Cured Film Pattern)

Following the same procedures as in Example 1, the solder resist ink composition was used to form a high-precision cured solder resist pattern.

Stickiness after preliminary drying, the developing test, the checkerboard tape peeling test, the heat-resistance test, the pencil hardness test, and the insulation tests were made. Results are summarized in Table 3.

EXAMPLE 17

(Third Invention)

A solder resist ink composition was prepared following the same procedures as in Example 11 except that 100 parts of photo-curable resin a-1 prepared in Example 11 and 60 parts of photo-curable resin d-1 prepared in Example 16 were used, as shown in Table 3.

Following the same procedures as in Example 1, the above solder resist ink composition was used to prepare a high-precision cured solder resist pattern. Stickiness after preliminary drying was checked, and the developing test, the checkerboard tape peeling test, the heat-resistance test, the pencil hardness test, and the insulation test were performed. Results are summarized in Table 3.

COMPARATIVE EXAMPLE 6

Photo-curable resin (Ra-3) synthesized in Comparative Example 3 was used. A solder resist ink composition was prepared following the same procedures as in Example 11 except that 150 parts of photo-curable resin Ra-3 were used singly.

Following the same procedures as in Example 1, the solder resist ink composition was used to form a solder resist pattern. The cured solder resist pattern was partially blistered during heating and curing. Stickiness after preliminary drying and the developing test, the checkerboard tape peeling test, the heat-resistance test, the pencil hardness test, and the insulation test were made. Results are summarized in Table 3.

COMPARATIVE EXAMPLE 7

Photo-curable resin (Ra-4) synthesized in Comparative Example 4 was used. A solder resist ink composition was prepared following the same procedures as in Example 11 except that 150 parts of photo-curable resin Ra-4 were used singly.

Following the same procedures as in Example 1, the solder resist ink composition was used to form a solder resist pattern. The cured solder resist pattern was partially blistered during heating and curing. Stickiness after preliminary drying and the developing test, the checkerboard tape peeling test, the heat-resistance test, the pencil hardness test, and the insulation test were made. Results are summarized in Table 3.

COMPARATIVE EXAMPLE 8

Photo-curable resin (Ra-5) synthesized in Comparative Example 5 was used. A solder resist ink composition was prepared following the same procedures as in Example 11 except that 150 parts of photo-curable resin Ra-5 were used singly.

Following the same procedures as in Example 1, the solder resist ink composition was used to form a solder resist pattern. The cured solder resist pattern was partially blistered during heating and curing. Stickiness after preliminary drying are checked, and the developing test, the checkerboard tape peeling test, the heat-resistance test, the pencil hardness test, and the insulation test were made. Results are summarized in Table 3.

TABLE 3

| | Example | | | | | | | Comparative Example | | |
|---|---|---|---|---|---|---|---|---|---|---|
| | 11 | 12 | 13 | 14 | 15 | 16 | 17 | 6 | 7 | 8 |
| a-1 | 100 | | | 100 | | | 100 | | | |
| c-1 | 50 | | | | 50 | | | | | |
| a-6 | | 100 | | | 100 | 100 | | | | |
| c-2 | | 50 | | 60 | | | | | | |

TABLE 3-continued

| | Example | | | | | | | Comparative Example | | |
|---|---|---|---|---|---|---|---|---|---|---|
| | 11 | 12 | 13 | 14 | 15 | 16 | 17 | 6 | 7 | 8 |
| ac-1 | | | 150 | | | | | | | |
| d-1 | | | | | | 50 | 50 | | | |
| Ra-3 | | | | | | | | 150 | | |
| Ra-4 | | | | | | | | | 150 | |
| Ra-5 | | | | | | | | | | 150 |
| Ethylene Glycol Mono-n-butyl Ether | 30 | 30 | 30 | 30 | 30 | 30 | 30 | 30 | 30 | 30 |
| Benzil Methyl Ketal | 2 | 2 | 2 | 2 | 2 | 2 | 2 | 2 | 2 | 2 |
| Phthalocyanine Green | 1.5 | 1.5 | 1.5 | 1.5 | 1.5 | 1.5 | 1.5 | 1.5 | 1.5 | 1.5 |
| Silica Powder | 2 | 2 | 2 | 2 | 2 | 2 | 2 | 2 | 2 | 2 |
| Talc | 30 | 30 | 30 | 30 | 30 | 30 | 30 | 30 | 30 | 30 |
| Sticking after Preliminary Drying | No | No | No | No | No | No | No | Yes | Yes | No |
| Developing Properties | Good | Good | Good | Good | Good | Good | Good | Fair | Good | Fair |
| Checkerboard Tape Peeling Test | 100/100 | 100/100 | 100/100 | 100/100 | 100/100 | 100/100 | 20/100 | 100/100 | 100/100 | 100/100 |
| Heat Resistance | OK | OK | OK | OK | OK | OK | OUT | OK | OK | OK |
| Pencil Hardness | 5H | 5H | 5H | 5H | 5H | 5H | 4H | 5H | 5H | 5H |
| *Electric Insulation Properties ① | 5.9 | 7.2 | 4.4 | 8.7 | 5.1 | 6.6 | 8.2 | 43.2 | 2.9 | 5.0 |
| ② | 6.8 | 8.3 | 3.1 | 4.5 | 3.7 | 8.7 | 4.7 | 83.9 | 6.7 | 5.2 |

*$\Omega$ cm ① $\times 10^{14}$
② $\times 10^{11}$

According to the solder resist ink composition of the present invention, the aqueous alkaline solution can be used to perform developing when the high-resolution protective film pattern is formed by photoetching. Therefore, the safe working atmosphere and workers' health can be assured.

In addition, typical advantages can also be provided such that the cured film pattern has a high heat resistance, a high hardness value, and good electrical characteristics. In addition, synthesis can be simply performed and highly reactive. No sticking occurs after preliminary drying.

What is claimed is:

1. A solder resist ink composition comprising:
   a photo-curable resin (A2) obtained by causing an unsaturated monocarboxylic acid to react with a cresolnovolak- or phenolnovolak- epoxy resin, and causing a polybasic carboxylic anhydride to react with the resultant reaction product;
   a photo-curable resin (B2) obtained by causing an unsaturated monocarboxylic acid to react with a bisphenol a novolak epoxy resin or epoxy vinyl cyclohexene-polyether resin, and causing a polybasic carboxylic anhydride to react with the resultant reaction product;
   at least one photo-polymerizable compound (C) selected from photo-polymerizable monomers;
   a photo-polymerization initiator;
   an organic solvent; and
   an inorganic filler,
   and which composition contains 0.1 to 0.5 equivalents of the photo-curable resin B2 with respect to 1.0 equivalents of photo-curable resin A2, wherein the equivalents are the original epoxy equivalents in the said cresolnovolak- or phenolnovolak- epoxy resin and in the bisphenol A novolak epoxy resin or epoxy vinyl cyclohexane-polyether resin.

2. A composition according to claim 1, which contains 1 to 15 parts by weight of the photo-polymerization initiator, 10 to 40 parts by weight of the organic solvent, and 10 to 60 parts by weight of the inorganic filler with respect to 100 parts by weight of the total weight of the photo-curable resin A2, the photo-curable resin B2, and the photo-polymerizable compound C.

3. A composition according to claim 1, wherein each of the photo-curable resins A2 and B2 is obtained by causing 0.7 to 1.2 equivalent of the unsaturated monocarboxylic acid to react with 1 epoxy equivalent of the novolak epoxy resin, and causing 0.5 to 1.0 equivalent of the dicarboxylic acid anhydride to react with 1 equivalent of the resultant reaction product.

4. A composition according to claim 1 which contains 0.01 to 0.2 equivalent of the photo-polymerizable compound C with respect to 1.0 equivalent of the total weight of the photo-curable resins A2 and B2.

* * * * *